United States Patent
Meyer et al.

(10) Patent No.: US 9,923,338 B2
(45) Date of Patent: Mar. 20, 2018

(54) INTERBAND CASCADE LASERS WITH LOW-FILL-FACTOR TOP CONTACT FOR REDUCED LOSS

(71) Applicant: The United States of America, as represented by the Secretary of the Navy, Washington, DC (US)

(72) Inventors: Jerry R. Meyer, Catonsville, MD (US); Igor Vurgaftman, Severna Park, MD (US); Chadwick Lawrence Canedy, Washington, DC (US); William W. Bewley, Falls Church, VA (US); Chul Soo Kim, Springfield, VA (US); Mijin Kim, Springfield, VA (US); Charles D. Merritt, Fairfax, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/172,338

(22) Filed: Jun. 3, 2016

(65) Prior Publication Data
US 2016/0359298 A1    Dec. 8, 2016

Related U.S. Application Data

(60) Provisional application No. 62/251,154, filed on Nov. 5, 2015, provisional application No. 62/209,554, filed (Continued)

(51) Int. Cl.
*H01S 5/22*    (2006.01)
*H01S 5/34*    (2006.01)
(Continued)

(52) U.S. Cl.
CPC .......... *H01S 5/3402* (2013.01); *H01S 5/0425* (2013.01); *H01S 5/1234* (2013.01);
(Continued)

(58) Field of Classification Search
CPC .... H01S 5/1237; H01S 5/1231; H01S 5/3402; H01S 5/342
See application file for complete search history.

(56) References Cited

U.S. PATENT DOCUMENTS

| 5,588,015 A | 12/1996 | Yang et al. |
| 5,684,816 A * | 11/1997 | Takagi ................. H01S 5/0425 359/344 |

(Continued)

FOREIGN PATENT DOCUMENTS

EP    1133035 A2    9/2001

OTHER PUBLICATIONS

C. S. Kim, M. Kim, J. Abell, W. W. Bewley, C. D. Merritt, C. L. Canedy, I. Vurgaftman, and J. R. Meyer, "Mid-infrared distributed-feedback interband cascade lasers with continuous-wave single-mode emission to 80° C.," Appl. Phys. Lett. 101, 061104 (2012).

(Continued)

*Primary Examiner* — Tod T Van Roy
(74) *Attorney, Agent, or Firm* — US Naval Research Laboratory; Joslyn Barritt

(57) ABSTRACT

A DFB laser having a reduced fill factor and reduced loss. A plurality of spaced-apart contact openings are etched into a dielectric layer situated on top of a laser ridge having a DFB grating layer so that electrical contact between the metal top contact layer and the DFB gratings is made only in the etched openings, since all other areas of the top surface of the DFB-grated laser ridge are insulated from the metal contact layer by the dielectric. The size and shape of contact openings and their spacing are configured so that the (Continued)

ratio of the total area of the openings to the total area of the laser ridge provides a fill factor of less than 100%.

20 Claims, 8 Drawing Sheets

Related U.S. Application Data on Aug. 25, 2015, provisional application No. 62/171,269, filed on Jun. 5, 2015.

(51) Int. Cl.
   *H01S 5/12* (2006.01)
   *H01S 5/042* (2006.01)

(52) U.S. Cl.
   CPC ............ *H01S 5/0424* (2013.01); *H01S 5/1231* (2013.01); *H01S 5/22* (2013.01); *H01S 2301/176* (2013.01)

(56) References Cited

U.S. PATENT DOCUMENTS

| | | | |
|---|---|---|---|
| 5,799,026 A | 8/1998 | Meyer et al. | |
| 6,204,078 B1 | 3/2001 | Inomoto | |
| 8,125,706 B2 | 2/2012 | Vurgaftman et al. | |
| 8,290,011 B2 | 10/2012 | Vurgaftman et al. | |
| 8,387,378 B2 | 2/2013 | Vurgaftman et al. | |
| 8,493,654 B2 | 7/2013 | Vurgaftman et al. | |
| 8,798,111 B2 | 8/2014 | Vurgaftman et al. | |
| 9,059,570 B1 | 6/2015 | Vurgaftman et al. | |
| 2002/0064199 A1* | 5/2002 | Takei | B82Y 20/00 372/46.012 |
| 2003/0231681 A1* | 12/2003 | Ungar | H01S 5/0425 372/45.01 |
| 2005/0123018 A1 | 5/2005 | Takagi et al. | |
| 2007/0165685 A1* | 7/2007 | Mizuuchi | H01S 5/0625 372/38.05 |
| 2008/0219315 A1 | 9/2008 | Makino et al. | |
| 2010/0189152 A1* | 7/2010 | Harder | H01S 5/02276 372/46.01 |
| 2012/0106583 A1 | 5/2012 | Watson et al. | |
| 2015/0063753 A1* | 3/2015 | Evans | G02B 6/34 385/37 |
| 2016/0126699 A1* | 5/2016 | Hirao | H01S 5/168 372/45.01 |
| 2016/0211646 A1* | 7/2016 | Avramescu | H01S 5/02461 |

OTHER PUBLICATIONS

Igor Vurgaftman, William W. Bewley, Chadwick L. Canedy, Chul Soo Kim, Mijin Kim, Charles D. Merritt, Joshua Abell, and Jerry R. Meyer, "Interband Cascade Lasers With Low Threshold Powers and High Output Powers," IEEE J. Sel. Topics Quant. Electron. 19, 1200120 (2013).

Michael von Edlinger, Julian Scheuermann, Robert Weih, Christian Zimmermann, Lars Nähle, Marc Fischer, Johannes Koeth, Sven Höfling, and Martin Kamp, "Monomode Interband Cascade Lasers at 5.2 µm for Nitric Oxide Sensing," IEEE Phot. Tech. Lett. 26, 480 (2014).

W. W. Bewley, C. S. Kim, M. Kim, I. Vurgaftman, C. L. Canedy, J. R. Lindle, J. Abell, and J. R. Meyer, "High-Performance Interband Cascade Lasers for $\lambda = 3\text{-}4.5$ µm," Int. J. High-Speed Electron. Syst. 21, 1250014 (2012).

S. Forouhar, C. Borgentun, C. Frez, R. M. Briggs, M. Bagheri, C. L. Canedy, C. S. Kim, M. Kim, W. W. Bewley, C. D. Merritt, J. Abell, Vurgaftman, and J. R. Meyer, "Reliable mid-infrared laterally-coupled distributed-feedback interband cascade lasers," Appl. Phys. Lett. 105, 051110 (2014).

C. S. Kim, M. Kim, W. W. Bewley, C. L. Canedy, J. R. Lindle, I. Vurgaftman, and J. R. Meyer, "High-Power Single-Mode Distributed-Feedback Interband Cascade Lasers for the Midwave-Infrared," IEEE Phot. Tech. Lett. 19, 158 (2007).

A. Lyakh, P. Zory, D. Wasserman, G. Shu, C. Gmachl, M. D'Souza, D. Botez, and D. Bour, "Narrow Stripe-Width, Low-Ridge High Power Quantum Cascade Lasers," Appl. Phys. Lett. 90, 141107 (2007).

C. S. Kim, M. Kim, W. W. Bewley, J. R. Lindle, C. L. Canedy, J. Abell, I. Vurgaftman, and J. R. Meyer, "Corrugated-sidewall interband cascade lasers with single-mode midwave-infrared emission at room temperature," Appl. Phys. Lett. 95, 231103 (2009).

Search Report and Written Opinion in corresponding International Application No. PCT/US2016/035652.

I. Vurgaftman, W.W. Bewley, C.L. Canedy, C.S. Kim, M. Kim, C.D. Merritt, J. Abell, J.R. Lindle, and J.R. Meyer, "Rebalancing of internally generated carriers for mid-infrared interband cascade lasers with very low power consumption," Nature Commun. 2, 585 (2011).

I. Vurgaftman, W.W. Bewley, C.L. Canedy, C.S. Kim, M. Kim, C.D. Merritt, J. Abell, J.R. Lindle, and J. Meyer, "Rebalancing of internally generated carriers for mid-infrared interband cascade lasers with very low power consumption," Nature Commun. 2, 585 (2011), at Figs. 1(a c).

* cited by examiner

INTERBAND CASCADE LASERS WITH LOW-FILL-FACTOR TOP CONTACT FOR REDUCED LOSS

CROSS-REFERENCE

This Application claims the benefit of priority under 35 U.S.C. § 119 based on U.S. Provisional Application No. 62/171,269 filed on Jun. 5, 2015; U.S. Provisional Application No. 62/209,554 filed on Aug. 25, 2015; and U.S. Provisional Application No. 62/251,154 filed on Nov. 5, 2015. The Provisional Applications, all references cited in the Provisional Applications, and all references cited herein are hereby incorporated by reference into the present disclosure in their entirety.

TECHNICAL FIELD

The present invention relates to interband and quantum cascade lasers, particularly to structure design for reduced loss in interband and quantum cascade lasers.

BACKGROUND

The interband cascade laser (ICL) is a promising semiconductor coherent source for the mid-IR (defined here as 2.5-6 µm) spectral region and, potentially, longer wavelengths.

The basic concept of the ICL was invented by Rui Yang in 1994, while he was at the University of Toronto, and was patented shortly later while he was at the University of Houston. See U.S. Pat. No. 5,588,015, "Light Emitting Devices Based on Interband Transitions in Type II Quantum Well Heterostructures."

The ICL differs from the mid-IR quantum cascade laser (QCL) in that ICLs employ interband transitions rather than the intersubband active transitions used by QCLs. The carrier lifetime associated with interband transitions is typically three orders of magnitude longer than for intersubband transitions, which ultimately results in more than an order-of-magnitude lower drive power in the ICL. The active transitions in most ICLs are spatially indirect (type-II), with electron and hole wavefunctions peaking in adjacent electron (e.g., InAs) and hole (e.g., GaInSb) quantum wells (QWs), respectively. In contrast to conventional diode lasers, both ICLs and QCLs have two n-type contact regions, at both ends of the device, for current flow.

Each active stage of an ICL contains a short-period chirped superlattice that displays highly-anisotropic electrical conduction. The active stages of QCLs are also electrically anisotropic, although QCLs typically have bulk InP cladding layers that are electrically isotropic.

In addition, to provide optical confinement, most ICLs employ moderately n-doped InAs/AlSb superlattice cladding layers, which also have anisotropic electrical resistance because the electron mobility in the plane of the short-period superlattice is far higher than that along the growth axis.

Following the initial development of the ICL, critical improvements to the basic ICL structure, such as including more than one hole well to form a hole injector, were made in a joint patent by Dr. Yang in collaboration with two of the inventors of the present invention. See U.S. Pat. No. 5,799,026 to Meyer et al., "Interband Quantum Well Cascade Laser with a Blocking Quantum Well for Improved Quantum Efficiency." This was followed by a number of additional patents by some of the inventors of the present invention, which introduced numerous further improvements to the ICL structure and operation. See U.S. Pat. No. 8,125,706 to Vurgaftman et al., "High Temperature Interband Cascade Lasers"; U.S. Pat. No. 8,493,654 to Vurgaftman et al., "High Temperature Interband Cascade Lasers"; U.S. Pat. No. 8,290,011 to Vurgaftman et al., "Interband Cascade Lasers"; U.S. Pat. No. 8,385,378 to Vurgaftman et al., "Interband Cascade Lasers"; U.S. Pat. No. 8,798,111 to Vurgaftman et al., "Interband Cascade Lasers with Engineered Carrier Densities"; and U.S. Pat. No. 9,059,570 to Vurgaftman et al., "Interband Cascade Lasers with Engineered Carrier Densities."

One of the most critical improvements was to substantially increase the doping density in the electron injector, so as to increase the electron density in the active QWs and thereby lower the lasing threshold current density ("carrier rebalancing"). U.S. Pat. No. 8,798,111 and U.S. Pat. No. 9,059,570, supra. This dramatically reduced the threshold power for ICL operation, to as low as 29 mW at room temperature.

However, most of the measures taken thus far to optimize the configurations for electrical contact and the waveguide for the lasing mode have followed conventional general principles known to the semiconductor laser community.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides important improvements to the structure of DFB lasers that will result in reduced internal loss, greater coupling to a DFB grating etched into the top of the waveguide or a deposited material, and lower thermal resistance in ICLs, QCLs, and other classes of semiconductor lasers with substantial current spreading and a given magnitude of internal loss. The improved structure provided in accordance with the present invention may also improve the efficiency and maximum output power of either DFB lasers or ridges designed for high power and brightness.

The present invention provides an approach for reducing the internal loss by reducing the fill factor of the top contact layer, i.e., reducing the percentage of the ridge's top surface in which electrical contact to the metal is made. The present invention accomplishes this by providing spaced-apart contact openings etched into at least some portion of a dielectric layer situated on top of the laser ridge so that electrical contact between the metal top contact layer and the laser ridge is only made in the areas patterned for the contact openings, since all other areas of the top surface of the laser ridge are insulated from the metal contact layer by the dielectric.

In some embodiments, the contact openings have a predetermined width w and spacing P, where w and P are configured to provide a predetermined top contact fill factor w/P of less than 100%.

In some embodiments, the low fill factor may be accomplished by forming stripes perpendicular to the ridge axis.

In other embodiments, the contact stripes with reduced fill factor may be placed near each edge and parallel to the ridge axis, so that they do not occupy the center of the ridge.

In some embodiments, the contact pattern may be periodic, and in such embodiments, the width w and the spacing P of the contacts can be tuned to produce an ICL having a predetermined duty cycle that optimizes the laser performance at a specified wavelength and temperature range. However, the contact pattern need not be periodic so long as the ratio of the total area of the openings to the total area of the laser ridge is less than 100%.

DETAILED DESCRIPTION

Figure 1:
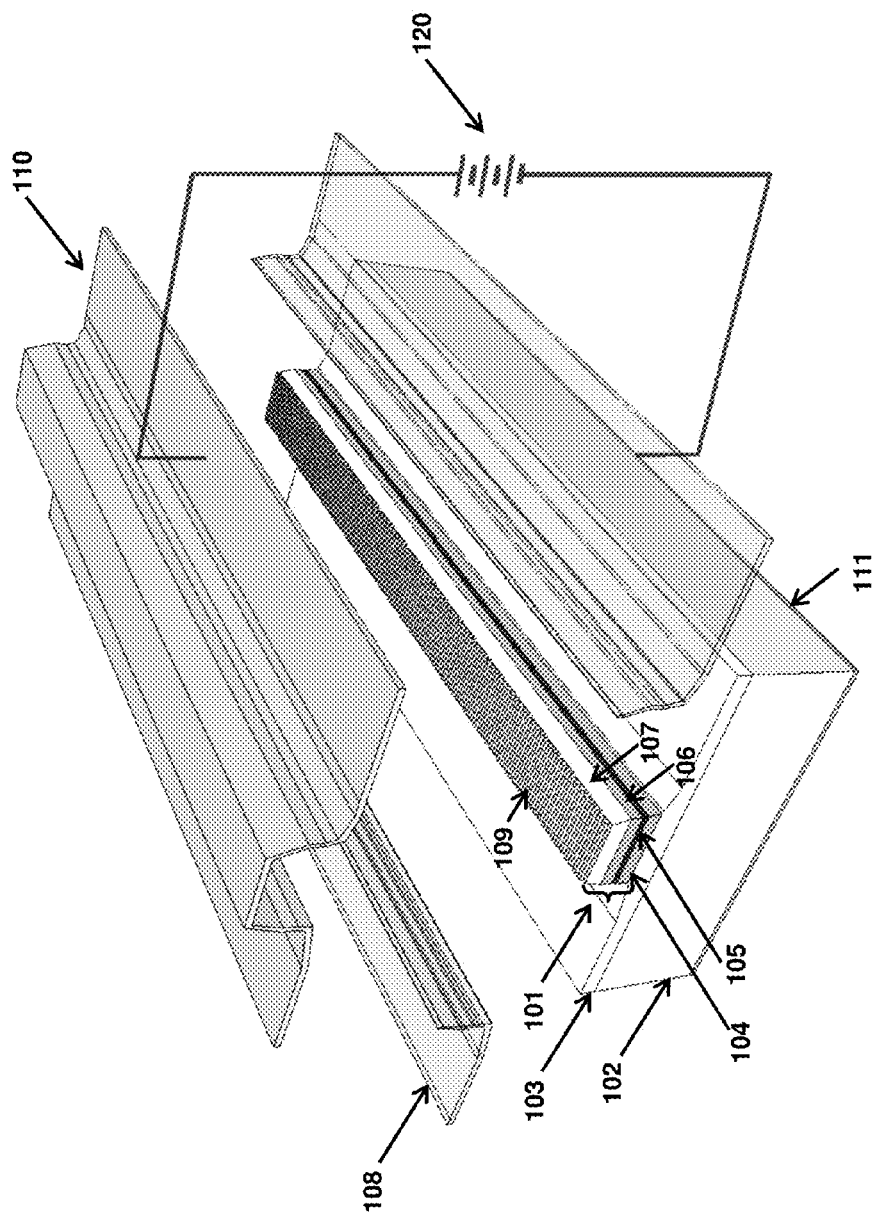
FIG. 1 is a schematic depicting an exemplary conventional interband cascade laser (ICL) having a distributed-feedback (DFB) grating on the top of the laser ridge and top contact covering most of the ridge's top surface in accordance with the prior art.

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The most straightforward geometry for realizing a semiconductor distributed-feedback (DFB) laser emitting in a narrow spectral line is to etch a grating into the top surface of a structure with a top cladding having a reduced thickness that allows substantial penetration of the optical mode into the grating region. See, e.g., C. S. Kim, M. Kim, J. Abell, W. W. Bewley, C. D. Merritt, C. L. Canedy, I. Vurgaftman, and J. R. Meyer, "Mid-infrared distributed-feedback interband cascade lasers with continuous-wave single-mode emission to 80° C.," Appl. Phys. Lett. 101, 061104 (2012) ("Kim 2012").

While alternative DFB geometries such as side gratings or a double mesa are possible, see Igor Vurgaftman, William W. Bewley, Chadwick L. Canedy, Chul Soo Kim, Mijin Kim, Charles D. Merritt, Joshua Abell, and Jerry R. Meyer, "Interband Cascade Lasers With Low Threshold Powers and High Output Powers," IEEE J. Sel. Topics Quant. Electron. 19, 1200120 (2013); Michael von Edlinger, Julian Scheuermann, Robert Weih, Christian Zimmermann, Lars Nähle, Marc Fischer, Johannes Koeth, Sven Höfling, and Martin Kamp, "Monomode Interband Cascade Lasers at 5.2 µm for Nitric Oxide Sensing," IEEE Phot. Tech. Lett. 26, 480 (2014); and W. W. Bewley, C. S. Kim, M. Kim, I. Vurgaftman, C. L. Canedy, J. R. Lindle, J. Abell, and J. R. Meyer, "High-Performance Interband Cascade Lasers for $\lambda$=3-4.5 µm," Int. J. High-Speed Electron. Syst. 21, 1250014 (2012); see also S. Forouhar, C. Borgentun, C. Frez, R. M. Briggs, M. Bagheri, C. L. Canedy, C. S. Kim, M. Kim, W. W. Bewley, C. D. Merritt, J. Abell, Vurgaftman, and J. R. Meyer, "Reliable mid-infrared laterally-coupled distributed-feedback interband cascade lasers," Appl. Phys. Lett. 105, 051110 (2014), these approaches have other disadvantages related to coupling strength to the grating, processing/performance yield, and/or maximum single-mode output power and efficiency.

The DFB grating can alternatively be formed in a Ge or other semiconductor or dielectric layer deposited on top of the ridge rather than being etched into the epitaxial III-V semiconductor material. See Kim 2012, supra. Following deposition of the Ge (or other) layer by e-beam evaporation or some other process known to the art, the grating is formed by lift-off lithography or some other means. This approach has the advantage of avoiding any etch damage to the pristine top surface of the epitaxial III-V semiconductor. Until recently, the slow writing times for most of the available e-beam lithography systems limited this approach to patterning a few DFB lasers at a time, rather than providing a practical tool for producing larger commercial device lots. See e.g., C. S. Kim, M. Kim, W. W. Bewley, C. L. Canedy, J. R. Lindle, I. Vurgaftman, and J. R. Meyer, "High-Power Single-Mode Distributed-Feedback Interband Cascade Lasers for the Midwave-Infrared," IEEE Phot. Tech. Lett. 19, 158 (2007) ("Kim 2007") However, newer e-beam writing instruments such as the Voyager™ Electron Beam Lithography system available from Raith Nanofabrication GmbH now make it quite feasible to pattern large areas within practical writing times.

The schematic in FIG. 1 illustrates an exemplary configuration of such a conventional DFB ICL. As illustrated in FIG. 1, a typical DFB ICL in accordance with the prior art includes a laser ridge 101 formed on a chip comprising a GaSb buffer/substrate layer 102 having a bottom cladding layer 103 (typically an InAs/AlSb short-period superlattice) disposed on a top surface thereof. Laser ridge 101 comprises bottom and top separate confinement layers (SCLs) 104 and 106 (typically lightly n-doped GaSb), with one or more active stages 105 situated between the SCL layers 104/106 and top cladding layer 107 (also typically an InAs/AlSb short-period superlattice) deposited on an upper surface of the top SCL 106. A grating layer (typically InAs or InAsSb) may be deposited on top of the top SCL to provide a uniform, relatively high-index material into which the grating may be etched. The top portion of this layer is usually n-doped more heavily for electrical contacting. As discussed above, a layer of Ge or some other material may alternatively be deposited on top of the structure to receive the grating, in which case the heavily n-doped top InAs or InAsSb contacting layer may be very thin. Not shown in the figure are various chirped transition superlattices placed between the various regions that aid the electrical transport from one region to the next.

An insulating dielectric film 108 (e.g., a thin SiN film) is deposited on the upper surface of the chip including the sidewalls of laser ridge 101 and is removed from the top surface of the ridge, e.g., by lift-off lithography or any other suitable means known to the art. A DFB grating 109 is etched into the exposed top grating layer, the thin top cladding layer 107, the other deposited material such as Ge, or some combination of those to produce distributed feedback that is usually sufficient to select lasing in a single spectral mode. A metal or combination of metals 110 suitable for contacting n-type InAs or InAsSb (such as Ti/Pt/Au) is then deposited on the entire top surface of the chip to provide contacting for electrical injection, and to provide electrical connection to a metal pad, typically placed to the side of the ridge, large enough for wire bonding. In all areas of the chip except the top of the ridge, the metal 110 lies on top of the deposited dielectric layer 108 to prevent shorting of the top and bottom of the device. Power is provided to the laser by means of the top metal contact 110 on top of the ridge 110 and a bottom metal contact layer 111 that is typically deposited on the bottom of the GaSb substrate. The top and bottom contacts are connected to opposite terminals of a voltage source 120. Because the upper surface of the ridge 101 into which the DFB grating 109 is patterned is not covered by dielectric film 108, except for a narrow portion near the sidewalls that remains covered by the dielectric 108 to prevent shorting of the sidewalls, electrical contact is made to the entirety of the DFB-patterned laser ridge.

Some semiconductor laser material systems allow the overgrowth of an electrically-conducting semiconductor with lower refractive index than the modal index to complete the top optical cladding layer and also provide a pathway for injecting electrical current into the semiconductor laser. However, no suitable overgrowth capability is currently available for ICLs grown on GaSb or InAs substrates. Therefore, for ICLs, the top of the grating itself must be metallized to provide the top electrical contact. In such cases, the coupling coefficient decreases exponentially with the top cladding thickness, and so for an ICL emitting at $\lambda \approx 3.5$ μm, the top cladding thickness must be reduced to at most $\approx 500$ nm if optical coupling to the grating is to be sufficient to suppress non-resonant longitudinal modes and assure the emission with a narrow linewidth.

The primary disadvantage of this geometry is that without an overgrown spacer layer, the lasing mode penetrates into the metal contact, introducing additional optical loss that also varies exponentially with the cladding thickness. While the magnitude of the extra loss depends on the contact metallization scheme, as will be discussed further below, a typical value for ICLs with conventional Ti/Pt/Au contacts is 2-3 $cm^{-1}$. Since this is comparable to the internal losses originating from all other sources combined, the mode overlap with the lossy metal inevitably degrades the slope and wallplug efficiency. If the top cladding layer is made thinner or the grating is etched deeper to enhance optical coupling to the grating, the loss increases correspondingly.

The present invention thus provides important improvements to the structure of DFB ICL lasers that will result in reduced internal loss, greater coupling to a DFB grating etched into the top of the waveguide or a deposited material, and lower thermal resistance in ICLs, QCLs, and other classes of semiconductor lasers with substantial current spreading and a given magnitude of internal loss. The improved structure provided in accordance with the present invention may also improve the efficiency and maximum output power of either DFB lasers or ridges without gratings that are designed for high power and brightness.

The present invention provides an approach for reducing the extra loss by reducing the fill factor of the top contact layer, i.e., reducing the percentage of the ridge's top surface in which electrical contact to the metal is made. The present invention accomplishes this by providing a plurality of spaced-apart contact openings etched into at least some portion of a dielectric layer situated on top of the laser ridge, which in preferred embodiments is the same dielectric layer that protects the ridge sidewalls and prevents shorting on other portions of the chip. Only in the areas patterned for contact openings does the etch into this dielectric layer provide contact between the metal and the exposed grating, InAs or InAsSb top contact layer, or top cladding layer lying below the dielectric, since all other areas of the top surface of the laser ridge are insulated and optically isolated from the metal contact layer by the dielectric.

Thus, in accordance with the present invention, a plurality of n contact openings can be formed in the dielectric layer, where the contact openings and spacing between the openings are configured so that a ratio of the total area of the openings to the total area of the laser ridge is less than 100%. The structure of an ICL in accordance with the present invention therefore stands in contrast to the structures used in all previous ICLs reported to date, in which all or nearly all of the top of the ridge is exposed to the metal contact layer, i.e., they have top contact layers with fill factors of approximately 100%.

In some embodiments, the contact openings in an ICL in accordance with the present invention can take the form of roughly rectangular "contact stripes" with full coverage perpendicular to the ridge axis and having a predetermined width w and spacing P along the ridge axis, where w and P are configured to provide a predetermined top contact fill factor w/P of less than 100%. In other embodiments, however, the openings can have an arbitrary shape. In addition, while in some embodiments, the contact openings are regularly spaced and/or symmetrically placed relative to the sides of the ridge, such regular and/or symmetrical placement is not necessary, and in some embodiments, the openings can be placed randomly on the surface of the laser ridge. Thus, any shape and/or spacing of the contact openings can be used so long as the contact openings are not so far apart that they can't provide uniform current spreading into the laser ridge and so long as the ratio of the total area of the openings to the total area of the laser ridge provides a fill factor of less than 100%.

The fraction of the internal loss associated with mode overlap with the contact metal is reduced linearly with the reduction in the fill factor of the top contact. For example, if the fill factor is reduced from 100 to 20%, i.e., reduced by a factor of 5, the extra loss is also reduced by about a factor of 5, e.g., to a value <1 $cm^{-1}$. Such a level of loss may have minimal effect on the device performance because it is smaller than other losses in the laser cavity, whereas a higher value of $\approx 2$-3 $cm^{-1}$ would usually impose a significant reduction of the device efficiency and maximum output power. Even lower fill factors in the 5-10% range may provide adequate electrical conduction, resulting in further reduction of the additional loss associated with thinning the top cladding layer.

The minimum width of each contact stripe or other contact opening feature that may be readily patterned with optical lithography with high reliability and high reproducibility is on the order of w≈10 µm. Therefore, a typical contact pattern may employ 10 µm wide stripes on a 50 µm period, which corresponds to a fill factor of 20%. Narrower stripes and lower fill factors are more easily realized with electron beam lithography, as will be discussed below.

However, a further consideration affecting the optimal fill factor is that heat dissipation is generally optimized by maximizing the area over which the semiconductor top surface is in direct physical contact with the top metal layer (that is, high fill factor), without an intervening dielectric layer that imposes additional thermal resistance. Therefore, reducing the fill factor to minimize the optical loss may at some point degrade rather than improve the laser performance because heating of the active stages in the laser core comes to have a greater effect than minimizing the loss. Although this effect has not been investigated systematically to date, the preliminary experimental results discussed below suggest that in some embodiments an intermediate fill factor in the range 14-33% may be optimal.

As described in more detail below, in some embodiments, the contact openings all have the same width w and same spacing P so that the contact stripes are periodic. However, as noted above, the placement of the contact openings need not be periodic, so long as none of the gaps between contact openings are larger than the current spreading length and so long as the total spacing between openings provides a low fill factor of less than 100%.

Figure 3:
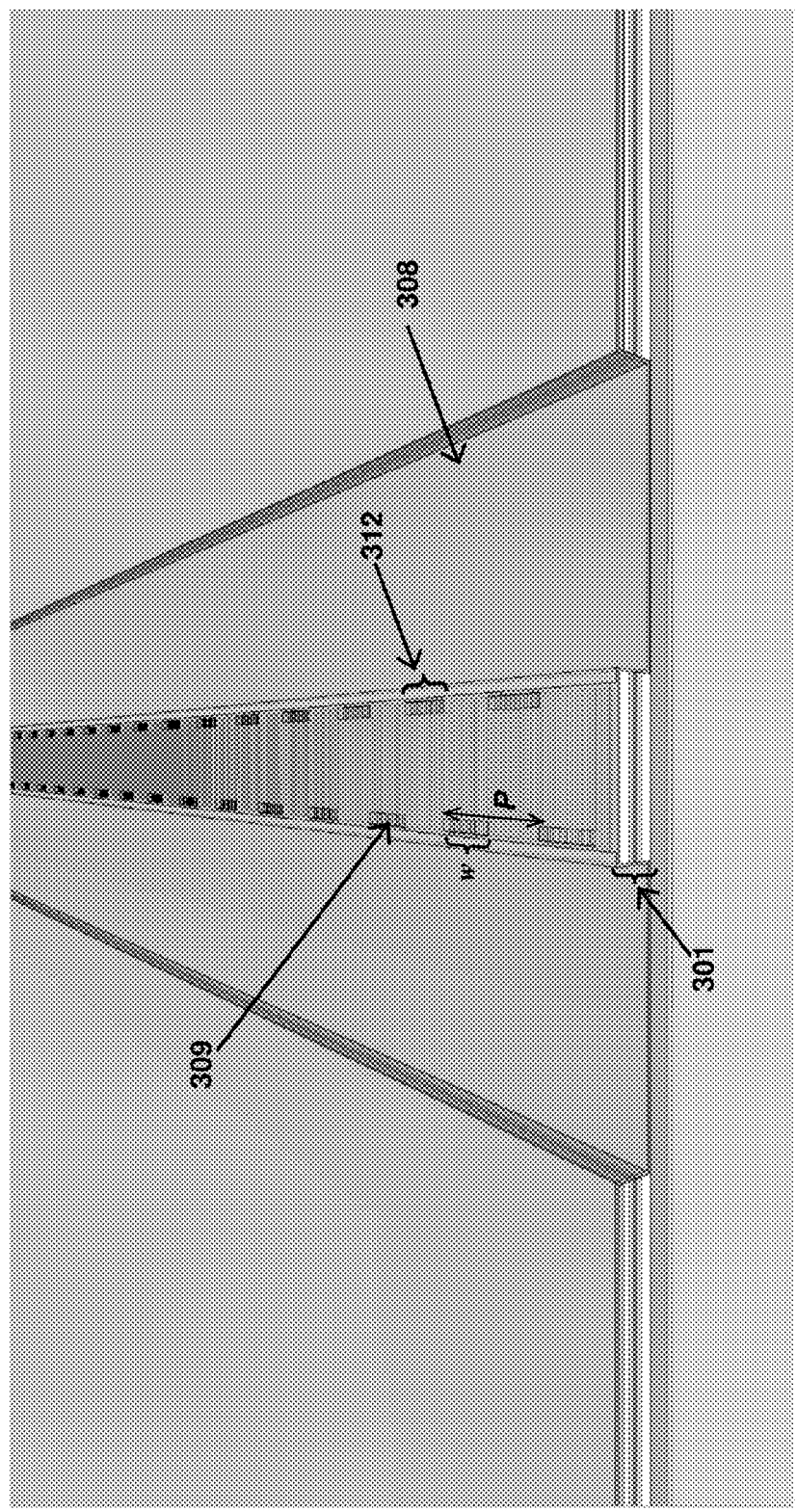
FIG. 3 is a schematic depicting aspects of another exemplary embodiment of an ICL having a low-fill-factor top contact structure in accordance with the present invention.

In some embodiments, the contact openings are placed perpendicular to the ridge axis and occupy the center of the ridge, while in other embodiments, the contact openings may be placed near one or both edge of the ridge, parallel to the ridge axis, such that the contact stripes do not occupy the center of the ridge, as shown in FIG. 3.

In other embodiments, the width w of the contact stripes also can be non-uniform, so long as the average width is configured so that w/P<100%.

In still other embodiments, each of the n contact stripes with index i formed in the dielectric layer can have a corresponding width $w_i$ and be separated from the (i+1)th neighboring stripe by a corresponding spacing $P_i$ such that the ratio of the average of all widths $w_i$ to the average of all the distances $P_i$ is less than 100%, i.e., $\overline{w_i}/\overline{P_i}<100\%$.

In addition, the duty cycle of an ICL's top contact layer is directly related to its fill factor if the contact pattern is periodic, i.e., an ICL laser ridge having a periodic top contact pattern with a duty cycle of 20% will also have a fill factor of 20%. The terms "low duty cycle contact pattern," "low duty cycle top contact," and "low fill factor" contact pattern can be used somewhat interchangeably to describe a contact pattern comprising a series of periodic openings. Thus, if the contact stripes are periodic, their width w and period P can be tuned to produce an ICL having a predetermined duty cycle that optimizes the laser performance at a specified wavelength and temperature range.

However, in all cases some care should be taken in optimizing the period P and the fill factor w/P of the patterned contact. To facilitate fabrication, and also to avoid parasitic feedback effects on the optical mode, a relatively-large period of P≥10 µm is preferable (or the spacing between the contact openings should be at least that large if the pattern is not periodic). ICLs are especially advantageous in this regard, since the injected currents are known to spread over large distances on the order of 100 µm. See, e.g., Forouhar, supra. This is because the top cladding and active regions are both comprised of short-period superlattices that have far lower electrical resistance in the plane than along the growth direction. With such a large distance for current spreading, contact pattern periods of up to 50-200 µm may be practical, whereas impracticably small periods would be needed for most non-cascade semiconductor lasers with very limited current spreading.

Figure 2:
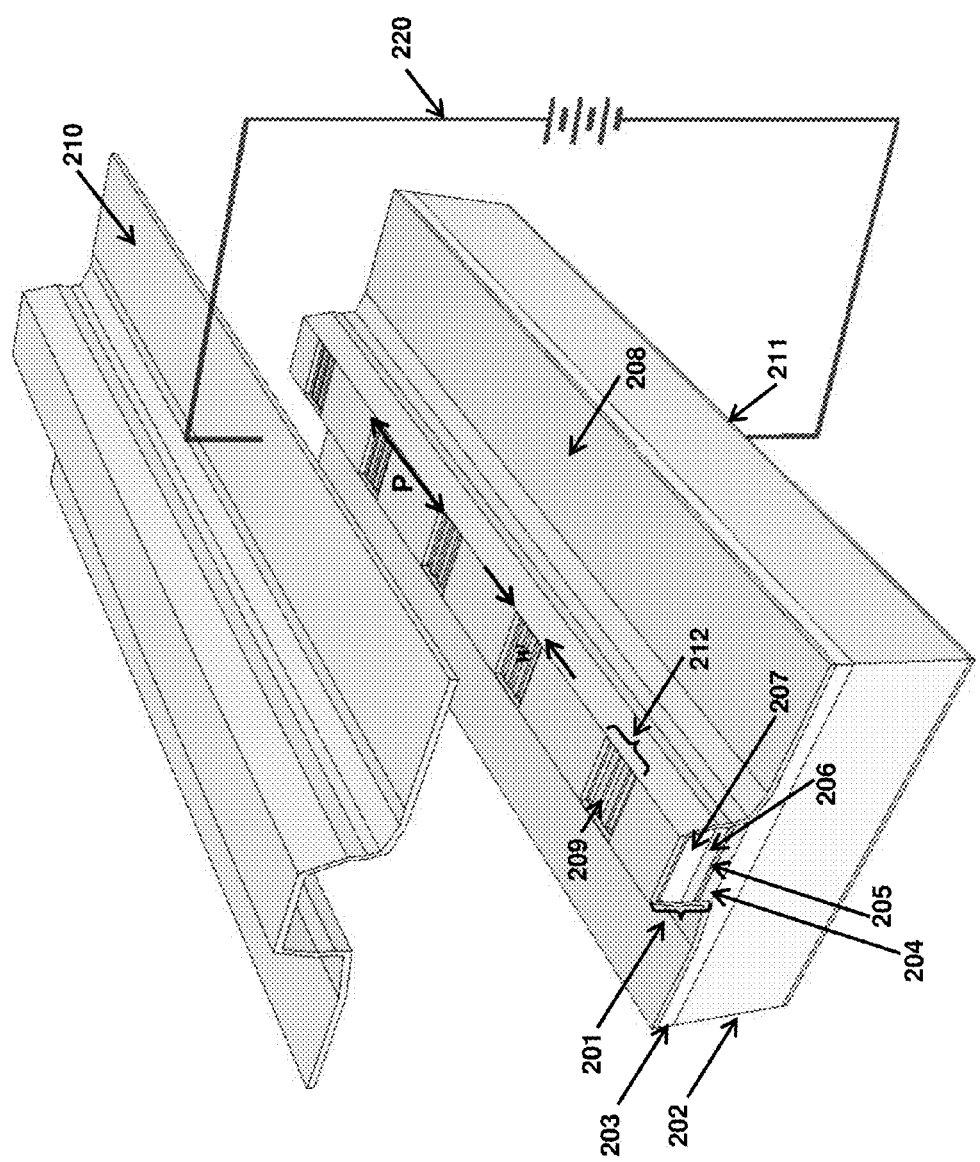
FIG. 2 is a schematic depicting aspects of an exemplary embodiment of an ICL having a low-fill-factor top contact structure in accordance with the present invention.
Figure 4:
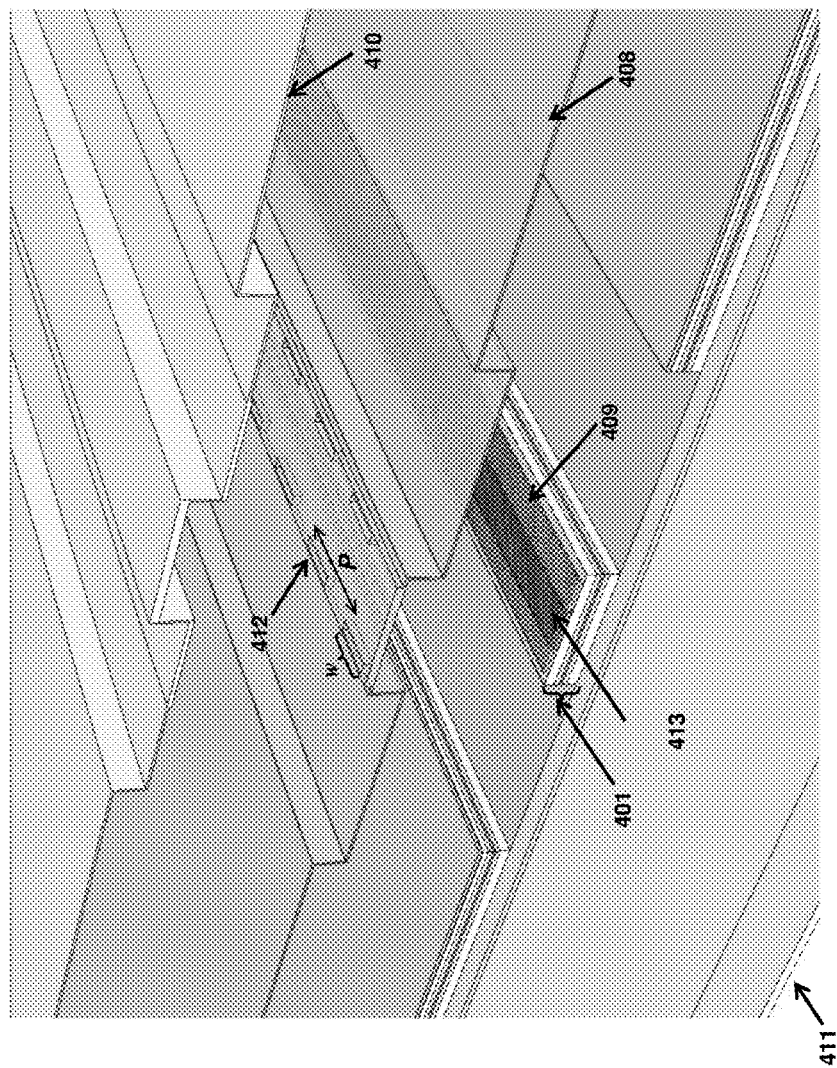
FIG. 4 is a schematic depicting aspects of still another exemplary embodiment of an ICL having a low-fill-factor top contact structure in accordance with the present invention.

FIGS. 2-4 illustrate aspects of various exemplary embodiments of an ICL having a low-fill factor top contact in accordance with the present invention. It will be noted here that in FIGS. 2-4 and in the description below, where a structural element appears in more than one FIGURE (and appearing in FIG. 1 described above), those elements are denoted by the same reference numeral, with only the first digit being changed to reflect the FIGURE in which they are shown. For example, laser ridge 101 shown in FIG. 1 described above corresponds to laser ridge 201 shown in FIG. 2, laser ridge 301 shown in FIG. 3, and laser ridge 401 shown in FIG. 4.

Thus, aspects of a first exemplary embodiment of an interband cascade laser (ICL) having a low-fill-factor top contact in accordance with the present invention is illustrated in the schematic shown in FIG. 2.

As can be seen in FIG. 2, an exemplary ICL having a low-fill-factor top contact in accordance with the present invention includes a laser ridge 201 formed with the same layers that were discussed above in connection with the conventional DFB ICL structure of FIG. 1. These include a GaSb substrate and buffer layer 202, an InAs/AlSb superlattice bottom cladding layer 203, a bottom GaSb SCL 204, one or more active stages 205, a top GaSb SCL 206, and an InAs/AlSb superlattice top cladding layer 207. As in the conventional DFB ICL described above with respect to FIG. 1, the DFB ICL in accordance with the embodiment shown in FIG. 2 also includes a DFB grating layer 209 that extends along some fraction of the length of laser ridge 201, where the grating layer may be a heavily n-doped InAs or InAsSb etching layer, a top cladding layer (e.g., an InAs/AlSb superlattice top cladding layer), or some other suitable material layer such as a Ge layer. The top and bottom metal contact layers 210 and 211 provide current flow from voltage source 220 to the laser.

In contrast to the conventional ICL of FIG. 1, in which the top metal contact covers the entire top surface of the laser ridge (apart from narrow stripes adjacent to each sidewall to prevent metal from reaching the sidewalls to create a shorting path) and therefore has a top contact fill factor of about 100%, in an ICL in accordance with the present invention the insulating dielectric film 208 such as SiN covers at least some of the top of laser ridge 201 as well as the sidewalls and flat areas adjacent to the laser ridge 201, extending laterally to cover bottom cladding layer 203. A plurality of spaced-apart contact openings or "contact stripes" 212 are etched into the dielectric film 208 at the top of the laser ridge to expose the DFB grating layer 209 in the etched areas. In some embodiments, the contact openings have a predetermined width w and a predetermined periodic spacing P, where P is measured as the distance between corresponding edges of the openings, for example, the distance between the right-hand edges of the openings as shown in FIG. 2, wherein w and P are configured to provide a predetermined top contact fill factor w/P of less than 100%.

Thus, in accordance with the present invention, electrical contact between the metal top contact layer 210 and the laser ridge 201 is only made in the areas patterned for the contact openings, since all other areas of the top surface of the laser ridge are insulated from the metal contact layer by the dielectric 208.

In some embodiments, the spacing P of the contact stripes can be configured to be much larger than the grating period so as to prevent resonant effects due to modulation of the loss and refractive index in the top contact which produce an unintended wavelength selectivity. In other embodiments, the distribution of the contact stripes may be randomized rather than employing a fixed period P in order to avoid any unintended resonances, although this is not expected to be an issue in most circumstances.

Once the contact with low fill factor of the invention has been implemented, the structure may optionally be electroplated with a thick gold layer to improve the heat dissipation and then can be mounted either epitaxial-side-up or epitaxial-side down on a heat sink.

In another embodiment of a DFB ICL having a low-fill-factor top contact in accordance with the present invention, aspects of which are illustrated in FIG. 3, the contact stripes are formed so that they do not cover the center of the ridge as they do in the embodiment shown in FIG. 2, but are placed near one or both sides of the ridge and run parallel to the axis of the laser ridge.

In this embodiment, a laser ridge 301 comprising the same layers described above with respect to the conventional configuration of FIG. 1 and the exemplary embodiment of the invention in FIG. 2 can be formed on a substrate and covered with a thin dielectric film 308 as described above with respect to FIG. 2. In accordance with this embodiment of the present invention, as in the embodiment described above with respect to FIG. 2, a series of narrow contact stripes 312 can be formed in the dielectric film 308 to provide a low-fill-factor top contact between the DFB grating layer 309 and the top metal contact.

However, as can be seen in FIG. 3, rather than running across the entire breadth of the ridge, including its center, in this embodiment the contact stripes 312 occupy regions near one or both sides of the ridge, running parallel to the edges of the ridge along the ridge axis. Using e-beam lithography to pattern the stripes in the dielectric should reliably provide contacts as narrow as ≈1-2 μm, residing ≈1 μm from each edge of the ridge. See Kim 2007, supra.

In some embodiments, such as that shown in FIG. 3, contact stripes 312 form two parallel rows, each line close to the edge of the ridge, while in other embodiments, the contact stripes may occupy only one side of the ridge. In embodiments having two parallel rows of contact stripes, the stripes may be directly opposite one from another so as to be in phase, while in other embodiments, such as that shown in FIG. 3, the stripes may be out of phase with one another, which has the advantage of minimizing the current spreading distance required for a pattern with a given fill factor. The low-duty-cycle contact stripes 312 may also be positioned at random rather than periodic intervals in order to further minimize the potential for distributed feedback at an undesired wavelength.

In embodiments of the invention that place the contact stripes at the sides of the ridge while not covering the center, as illustrated in FIG. 3, the contact stripes impose more loss at the edges of the ridge than in the center, and as a result suppress higher-order lateral modes in a manner similar to the effect of corrugated sidewalls. Although patterning two uninterrupted stripe contacts parallel to the ridge axis and running near each edge of the ridge along its entire length (as in Kim 2007, supra) would also effectively lower the contact duty cycle somewhat, since there is no metal in the center of the ridge, such an approach provides only very limited flexibility for tuning the fill factor, whereas a pattern of a plurality of contact stripes with gaps in between, as in the present invention, provides a much greater degree of flexibility in obtaining a reduced fill factor.

In another exemplary embodiment, a laser having a low-fill-factor top contact in accordance with the present invention may employ a "pole" deposited in the center of the ridge on top of the grating, where the pole is formed with width roughly half that of the ridge, from Si or another suitable material having a relatively high refractive index.

FIG. 4 illustrates aspects of an exemplary configuration of this embodiment of the present invention. As illustrated in FIG. 4, a laser ridge 401 is formed on a substrate. The layer structure of laser ridge 401 is the same as that described above with respect to FIGS. 1 and 2 and therefore will not be described in detail here.

As in the other embodiments described with respect to FIGS. 2 and 3 above, the laser structure also includes DFB grating layer 409 on top of the laser ridge 401, where the DFB grating layer may be an n-doped InAs or InAsSb etching layer, an InAs/AlSb superlattice top cladding layer, or some other suitable material layer such as a Ge layer. Also as in the other embodiments of the present invention, in the embodiment illustrated in FIG. 4, an insulating dielectric layer 408 is deposited over the entire structure including the top and sides of laser ridge 401, and a series of contact openings 412 are formed in dielectric layer 408, so as to reduce the contact fill factor as described above. In some embodiments, the contact openings 412 are periodic, with the stripes having a width w and a spacing P configured to provide a low-fill-factor top contact layer in the manner described above with respect to FIG. 2.

In addition, in accordance with this embodiment of the present invention, a thin pole layer 413 of Si or some other material having a high refractive index relative to the contact metal or the dielectric is deposited in the middle portion of the ridge on top of DFB grating layer 409 before the dielectric layer 408 is deposited. Depositing this additional material with high refractive index near the center of the ridge effectively raises the refractive index in the central portion of the ridge and enhances selection of the desired fundamental lateral mode which has its highest intensity at the center of the ridge. When reduced to practice (without low-fill contacts) by the inventors at the Naval Research Laboratory (NRL), using such a pole layer yielded DFBs with excellent mode selection.

In these embodiments, the presence of this Si pole layer 413 in the ICL structure in this embodiment further lowers the loss by providing additional separation between the lasing mode and the top metal contact, since in the center of the ridge the metal now resides on top of both the insulating layer 408 and the Si pole layer 413 as well as the etching layer or other deposited material such as Ge. In the embodiment illustrated in FIG. 4, the contact stripes are placed near the edges of the ridge, parallel to the ridge axis, and do not cover the central portion of the ridge, as shown in FIG. 3. In other embodiments, the contact stripes can be placed perpendicular to the ridge axis to provide full coverage of the central portion of the ridge, as shown in FIG. 2.

It will be noted here that although the contact stripes 412 shown in FIG. 4 are uniform, periodic, and parallel to the axis of the laser ridge, one skilled in the art will recognize that the other configurations of the contact stripes described herein are also possible within the scope of this embodiment, i.e., the stripes can be non-uniform, non-periodic, and/or perpendicular to the axis of the laser ridge, so long as the contact openings are not so far apart that they can't provide uniform current spreading into the laser ridge and so long as the ratio of the total area of the openings to the total area of the laser ridge provides a fill factor of less than 100%.

The advantages of a low-fill-factor top contact structure in accordance with the present invention can be seen from the following Examples.

Example 1

As a first example, preliminary experimental results for the low-fill top-contact geometry have been obtained for an ICL emitting at λ≈3.4 The structures examined were narrow ridges that were 19 μm wide and 2 mm long, with uncoated facets and mounted epitaxial-side-up with gold electroplating for heat dissipation. The 5-stage ICL design had a 570 nm-thick top cladding layer with a 20-nm-thick n$^+$-InAs layer on top for contacting. The cladding was thin enough to allow significant overlap of the lasing mode with the contact metallization. A SiN dielectric insulating layer was deposited on the top and sides of the ridge before metallization, after which optical lithography was used to pattern contact stripes in the insulating film with a periodic low-duty-cycle pattern as illustrated in FIG. 2. The contacts were patterned such that the width w of each contact stripe was kept constant while the period was adjusted to obtain duty cycles of 10% (period P=100 μm), 20% (P=50 μm), and 50% (P=20 μm). The results were compared to those for ridges having the conventional design in which the metal contact covered the entire top surface of the ridge (as in FIG. 1, only without the DFB grating), which corresponds to a contact duty cycle of 100%.

Figure 5:
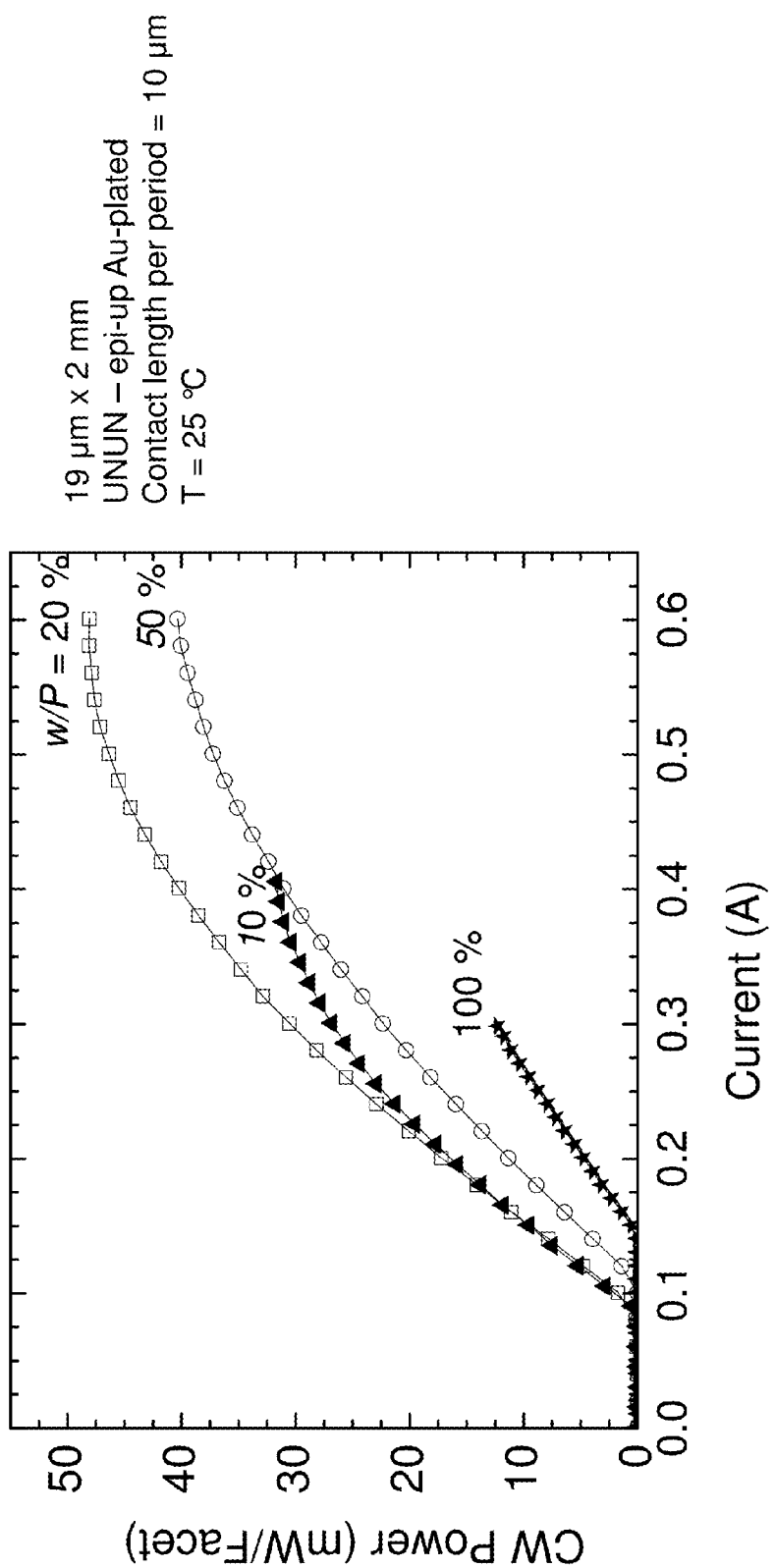
FIG. 5 is a plot of light-current characteristics in continuous wave (cw) mode at room temperature for exemplary ICLs having a thin top cladding and various periodic contact duty cycles of the top contact in accordance with one or more aspects of the present invention.

The plots in FIG. 5 show the resulting cw light-current characteristics measured for the structures having the 10%, 20%, 50%, and 100% duty cycles. As can be seen from the plots in FIG. 5, the slope efficiency for the device with 20% duty cycle is improved by >70% relative to the unpatterned control sample having a 100% duty cycle, while the threshold current is reduced by nearly a factor of 2.

These improvements in slope efficiency and lasing threshold are directly attributable to the reduction of the metal loss from the top contact. We estimate a loss reduction of up to 15 cm$^{-1}$ if a typical internal efficiency of 80% is assumed. Comparable slope efficiency and threshold are observed for the 10% duty cycle, which implies that most of the available loss reduction may already be realized in the 20% duty cycle case. The more rapid roll-over of the L-I characteristic for the 10% duty cycle data may be due to either inadequate current spreading or the higher thermal resistance associated with lower contact duty cycle. The results of this very preliminary reduction to practice imply a preferred duty cycle in the 10-30% range.

Figure 6A:
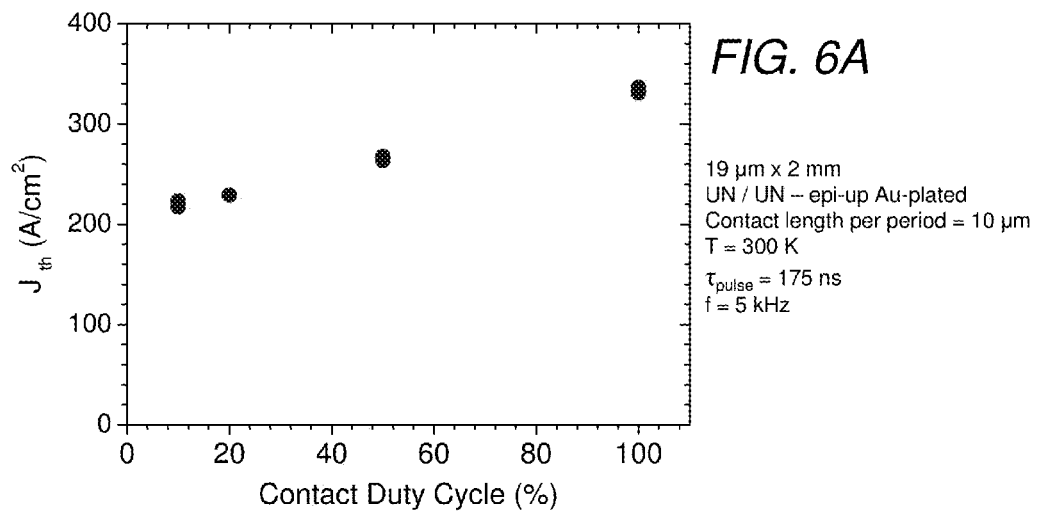
FIGS. 6A and 6B are plots illustrating the dependences of pulsed threshold current density (FIG. 6A) and pulsed slope efficiency (FIG. 6B) for exemplary ICLs having a thin top cladding and various periodic contact duty cycles of the top contact in accordance with one or more aspects of the present invention.
Figure 6B:
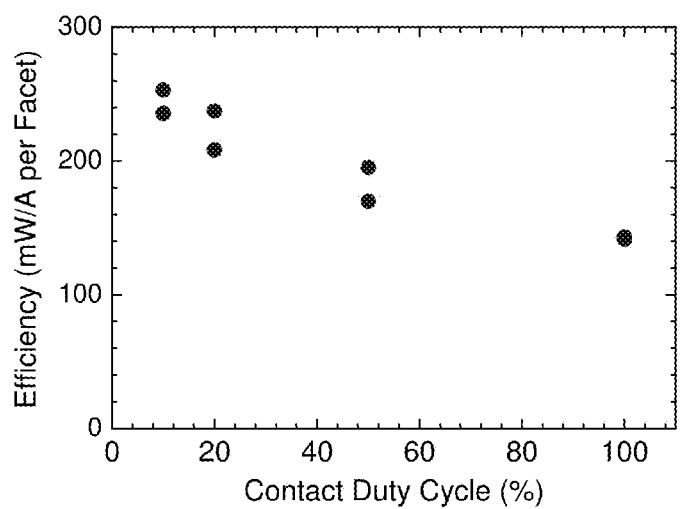

FIGS. 6A and 6B plot analogous pulsed results for the dependences of threshold current density $J_{th}$ and slope efficiency on periodic contact duty cycle for two thin-top-cladding ICL devices with each duty cycle, where FIG. 6A shows the pulsed threshold current density at room temperature vs. contact duty cycle for thin-top-cladding ICLs (19-μm-wide, 2-mm-long ridges) and FIG. 6B shows the pulsed slope efficiency at room temperature vs. contact duty cycle.

As can be seen from the plots in FIGS. 6A and 6B, the lasing threshold current density $J_{th}$ (FIG. 6A) decreases and the laser efficiency (FIG. 6B) increases as the duty cycle is reduced. The lasing threshold continues to decrease and the efficiency continues to increase down to the lowest duty cycle of 10%. These results support the conclusion that the lower duty cycles obtained from the low-fill-factor top contact layer in accordance with the present invention provide superior performance as compared to the 100% fill factor structures employed in conventional ICLs. The modest continuing improvement observed for the lasers with a 10% duty cycle suggest that a higher thermal resistance may have been responsible for the more rapid roll-over in the cw results shown in FIG. 5.

Example 2

As a second example, the low-fill-factor top contact structure of the present invention was applied to DFB ICLs operating at a wavelength around 3.3 μm. The ICL structure was grown on a GaSb substrate with a layering design similar to that for the wafer employed in the first reduction to practice discussed above, except that the top InAs layer was 250 nm thick to provide a grating layer into which the DFB grating could be etched. Only the top 20 nm of this structure was heavily doped (to $5 \times 10^{18}$ cm$^{-3}$), whereas in a more preferred embodiment of the invention, the entire grating layer would have been heavily doped. Because the InAs was not lattice-matched to the GaSb substrate, that layer relaxed and exhibited a cross-hatched morphology. Nevertheless, most of the DFBs with grating pitches in the range 558-568 nm lased in a single spectral mode for at least some ranges of temperatures and currents. This lot of devices did not employ the low-loss Ag or Ti—Ag contacts of some embodiments of the invention, but instead used conventional Ti/Pt/Au layers for the top contact metal. The devices had a dielectric layer deposited on the top cladding layer of the DFB device, with periodic contact openings formed therein in accordance with the present invention to provide a low-fill-factor top contact layer. As with the first example discussed above, the width of the contacts was held fixed at w=10 μm, while the period P was tuned such that the fill factor w/P—and thus the duty cycle—varied between 14% and 100%.

Figure 7:
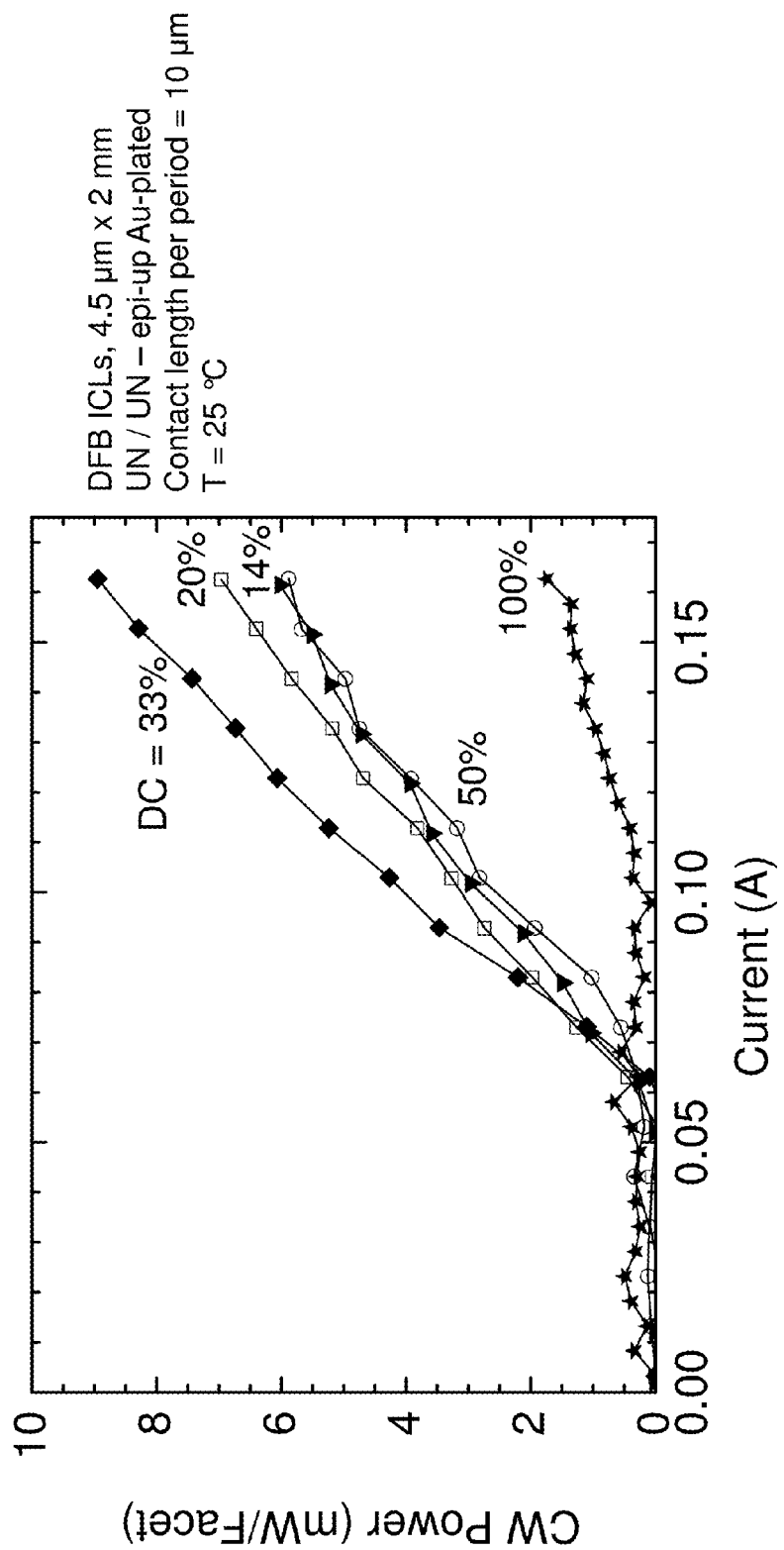
FIG. 7 is a plot of light-current characteristics for exemplary DFB ICLs having a thin top cladding and various periodic contact duty cycles of the top contact in accordance with one or more aspects of the present invention.

FIG. 7 shows the cw light-current characteristics measured for one series of DFB ICL ridges having varying contact duty cycles (14-100%), where the ridges were about 4.5 μm wide and 2 mm long and were mounted epitaxial-side-up with uncoated facets and gold electroplating for heat dissipation. These devices all lased in a single spectral mode at some range of temperatures and currents, although some only at temperatures above 25° C. Note from the figure that the observed slopes are highest for the devices with 20% and 33% duty cycles, and that both the threshold current and the slope efficiency are much worse for the device with 100% duty cycle. The tendency to lase in a single spectral mode did not show any apparent dependence on contact duty cycle. The highest cw power emitted in a single spectral mode was 6.8 mW for the DFB with 33% duty cycle.

Figure 8A:
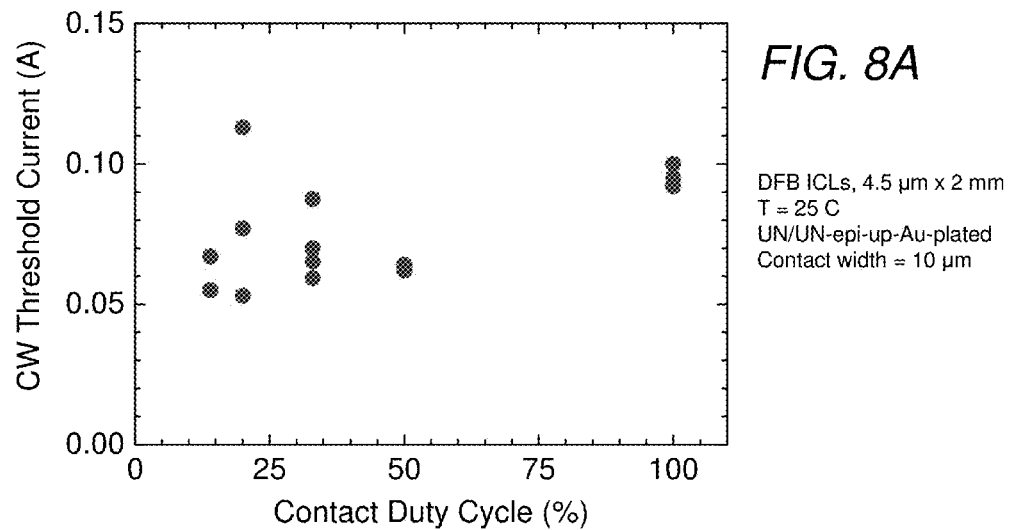
FIGS. 8A and 8B are plots illustrating threshold currents (FIG. 8A) and differential slope efficiencies (FIG. 8B) vs. periodic contact duty cycle for exemplary DFB ICLs having a thin top cladding in accordance with one or more aspects of the present invention.
Figure 8B:
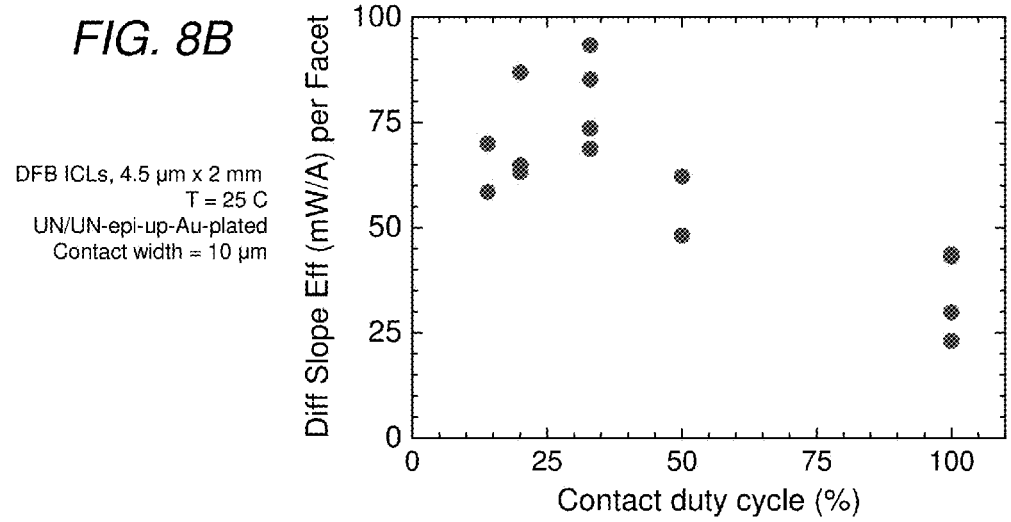

FIGS. 8A and 8B plot the corresponding threshold currents and differential slope efficiencies vs. duty cycle for all of the DFB ICLs that were tested, where FIG. 8A shows the threshold current for continuous-wave lasing at room temperature vs. contact duty cycle for DFB ICLs (at least two DFB devices with each duty cycle being measured), and FIG. 8B shows the cw differential slope efficiency at room temperature vs. contact duty cycle for the same DFB ICLs as in FIG. 8A.

While there is scatter in the data, the best thresholds clearly decrease at 50% duty cycle and below, while the efficiencies increase. The very lowest threshold was obtained with 20% duty cycle, while the highest slope efficiency was obtained with 33%. As in the case of Example 1, this testing clearly shows that devices with the reduced contact duty cycle of the invention show superior performance to those with the conventional 100% duty cycle.

Devices with the same ridge width from the same processing lot, but which did not have DFB gratings, were processed in parallel with the DFB devices. The contacts to those devices had duty cycles of 20, 33, and 100%. At T=25° C. the non-DFB devices with 100% duty cycle did not lase at all in cw mode, while those with 20% duty cycle had lower thresholds and higher differential slope efficiencies than the ones with 33% duty cycle. The thresholds were generally much higher and the efficiencies much lower than for the devices with DFB gratings. This may be because the etch was deeper for the non-DFB ridges than for those with DFB gratings.

Advantages and New Features

A primary advantage of the low-duty-cycle top contact of the invention is that semiconductor lasers constructed from materials subject to substantial current spreading may use a thin top cladding layer and yet maintain low internal loss induced by overlap of the optical mode with the contact metallization. The invention will be especially advantageous when applied to high-power interband cascade lasers, and to single-mode DFB ICLs emitting high powers with high efficiency. The combination of a heavily-doped $InAs_{0.91}Sb_{0.09}$ top grating/capping layer with the low-duty-cycle top contact metallization will maximize the maximum output power and efficiency of DFB ICLs while maintaining high processing yield with a fully strain balanced structure.

Alternative Embodiments and Design Considerations

The present invention encompasses several variations on the preferred embodiments presented above. Although the details may vary somewhat, the invention's advantages apply equally to any ICL core design, emission wavelength, type-II or type-I active quantum wells, etc. The invention may also be advantageous when applied to quantum cascade lasers (QCLs), since those devices can also exhibit substantial current spreading. See A. Lyakh, P. Zory, D. Wasserman, G. Shu, C. Gmachl, M. D'Souza, D. Botez, and D. Bour, "Narrow Stripe-Width, Low-Ridge High Power Quantum Cascade Lasers," Appl. Phys. Lett. 90, 141107 (2007). Although QCLs grown on InP or GaAs substrates may employ a regrowth step following the grating etch to provide low-loss DFB devices, that additional step adds to the production expense and can negatively influence the processing yield. While other diode laser types or specific device geometries may exist that also exhibit sufficient current spreading (more than about 20 µm) for the invention to be effective, in most cases the invention will not be applicable to conventional diode lasers because in such devices the current spreading is insufficient to maintain uniform current injection if a reasonable patterning period is employed.

In addition, as noted above, one type of device for which the invention can be used advantageously to reduce the threshold current and increase the output efficiency is a single-mode ICL with a DFB grating on top of the ridge, since a thin top cladding layer is mandatory in such a structure to assure adequate coupling of the optical mode to the grating.

Unpublished device processing investigations at NRL have shown that the internal loss induced by a given mode overlap with the contact metallization depends on the particular metal(s) used for the contact. While the most robust and widely-used metallization for contacting $n^+$-InAs is Ti/Pt/Au, that combination induces a high loss at mid-IR wavelengths.

Mode simulations incorporating published optical constants for the various relevant metals indicate that the loss should be lower if the Ti and Pt layers are greatly reduced in thickness or eliminated entirely, as has been demonstrated for a Ag contact. This has been confirmed experimentally at NRL through measurements of the slope efficiencies for ICLs processed using different top contact metallization recipes. While Ag does not adhere as well to the semiconductor surface as Ti/Pt/Au, a very thin (e.g., 10 nm) Ti layer deposited first can help the adherence, so as to combine lower loss (even with the thin Ti) with adequate physical robustness.

This approach may employ either Ti/Pt/Au contacts or (Ti)/Ag contacts for lower loss, although the limitations discussed above concerning relaxation of the grating layer when non-lattice-matched InAs is employed, or the diffusion of Ag into the epi-layer during the bottom contact anneal when lattice-matched InAsSb is employed, also apply to this embodiment. With very low fill factors being possible, however, the optical loss associated with employing Ti/Pt/Au contacts may be relatively insignificant.

Generally, for non-DFB ICLs the final layer of the epitaxial growth by molecular beam epitaxy (MBE) is an $n^+$-InAs capping layer that provides low electrical resistance after the Ti/Pt/Au or Ag contact is deposited. Although InAs is not lattice-matched to GaSb, unlike the rest of the epitaxial structure, the defects associated with strain relaxation are usually not severe because the typical thickness of the InAs capping layer is only about 20 nm.

However, these considerations change when a DFB grating is to be etched into the top of the epitaxial structure. While an InAs grating layer is favorable in most respects, the grating depth required to assure adequate coupling to the lasing mode is at least ≈150-300 nm. NRL experiments have shown that since InAs is not lattice-matched to the rest of the ICL structure grown on a GaSb substrate, the surface morphology of an InAs grating layer grown to the required thickness exhibits considerable cross-hatching due to numerous dislocations that form.

While preliminary experiments suggest that high-performance ICL ridges may be possible despite the questionable quality of an InAs grating layer, a lattice-matched or strain-compensated grating/capping layer would be preferable. Such a layer would reduce the risks of low processing yield and/or shortened device lifetime.

Two possibilities for the capping layer are the $InAs_{0.91}Sb_{0.09}$ alloy, which has properties similar to InAs (with slightly smaller bandgap) but is lattice-matched to GaSb, or the same short-period InAs/AlSb superlattice that is employed for the optical cladding layers (combined with a thin, more heavily-doped superlattice or InAs capping layer). The InAsSb option is preferable from the contacting standpoint, although NRL experiments indicate that a superlattice contact may also be acceptable.

Both of these choices present another difficulty, however, that has emerged in the course of further NRL processing investigations. When a Ag contact (with or without a thin Ti adherence layer) is applied to either InAsSb or an InAs/AlSb superlattice, Ag diffuses far into the epitaxial semiconductor structure during the annealing step (at 300° C.) that is required to assure adhesion of the Cr/Pt/Au back contact to the $n^+$-GaSb substrate. This diffusion degrades the epitaxial material, and especially the grating quality. Since this excessive diffusion is not observed to occur when a Ag contact is deposited on InAs rather than InAsSb or InAs/AlSb, the diffusion appears to be associated with the presence of Sb (and possibly also Al). It follows that without the low-fill-factor-contact scheme of the invention, the performance of a top-contact DFB ICL is inevitably constrained by either questionable processing quality (when a thick non-lattice-matched InAs capping layer is combined with Ag contact metallization), or low laser efficiency due to excessive optical losses (when an InAsSb or InAs/AlSb superlattice top contact is employed in conjunction with Ti/Pt/Au metallization).

A second significant limitation of using moderately-doped ($<10^{17}$ cm$^{-3}$) InAs as the relatively-thick grating layer material is that interband absorption will degrade the output power and efficiency at any lasing wavelength below about 3.5 μm, and will most likely preclude lasing at any wavelength shorter than about 3.2 μm. With its even smaller energy gap, moderately-doped $InAs_{0.91}Sb_{0.09}$ begins to absorb wavelengths as long as about 4.6 μm, and will strongly absorb at λ≲4.1 μm.

More quantitatively, undoped InAs and InAsSb absorb quite strongly any wavelength shorter than their energy gaps of 3.5 and 4.6 um, respectively. These wavelength limits become somewhat longer, due to the Burstein-Moss shift of the energy gap imposed by band filling within the conduction band, when the layers are doped to $5\times10^{17}$ cm$^{-3}$ to insure good electrical transport. Assuming that the maximum photon energy for lasing must be $2k_BT$ (where $k_B$ is the Boltzmann constant and T is temperature) smaller than the difference between the electron and hole quasi-Fermi energies (since some fraction of the electron states below the Fermi level remain unoccupied), the minimum photon energies for which lasing may be expected to occur decrease to about 3.2 and 4.1 μm, respectively. These values still impose a significant restriction on the available wavelengths over which high-performance single-mode lasing may be expected from a top-contact DFB.

In combination with a further modification of the grating/capping layer design to be disclosed below, all of these challenges can be overcome by adopting the low-fill-factor contact geometry of the invention. Because a structure in accordance with the present invention substantially reduces the net overlap of the lasing mode with metal, a Ti/Pt/Au contact can be employed in conjunction with a lattice-matched $InAs_{0.91}Sb_{0.09}$ (or InAs/AlSb superlattice) grating layer, while still reducing the internal loss because only a fraction of the mode penetrating to the top of the epitaxial layer actually encounters any metal.

In order to apply this geometry to DFB ICLs emitting at wavelengths shorter than 4.1 μm, in some embodiments, the $InAs_{0.91}Sb_{0.09}$ capping layer can be heavily n-doped to $\geq 2\times10^{18}$ cm$^{-3}$, with $2.5\times10^{18}$ cm$^{-3}$ being preferred, with the doping being throughout the entire layer rather than just in the top capping layer used to make electrical contact. This will have the effect of inducing a substantial Burstein-Moss shift of the effective bandgap to a much shorter wavelength. With this modification, interband absorption losses will remain negligible in DFB ICLs emitting at wavelengths below 3 μm. We also estimate based on mode overlap simulations that the additional free carrier absorption loss associated with the heavy doping will be no greater than about 0.1 cm$^{-1}$, which is insignificant compared to other internal losses in the waveguide. However, if the entire grating layer is doped to much more than $2.5\times10^{18}$ cm$^{-3}$, the resulting plasma-driven reduction of the refractive index will reduce the coupling strength of the DFB grating.

Moreover, while the low-fill-factor top contact layer of the present invention reduces the loss associated with a Ti/Pt/Au contact deposited on top of a DFB grating etched into the grating layer of a conventional ICL structure having a thin top cladding layer, the use of those metals still induces additional loss that lowers the device efficiency and maximum output power. Even using the low-fill-factor contacts of the invention, it is still preferable to employ low-loss Ag or Ti/Ag (with the Ti only ≈10 nm thick) for the top contact.

Another embodiment of the invention therefore reorders the usual processing steps to form the Cr/Pt/Au bottom contact (to the GaSb or InAs substrate) with its high-temperature anneal before the top contact is formed, and then deposit the top contact at a later stage. This has the advantage of eliminating the need for a high-temperature anneal after the top Ag metallization has been deposited, since annealing when the Ag is present causes the unacceptable extensive Ag diffusion into the grating layer that was discussed above.

Furthermore, experiments at NRL have confirmed that the much shorter exposure to high temperatures that occurs during epitaxial-side-down mounting of a DFB or other ridge ICL does not cause the same detrimental excessive diffusion of the Ag.

However, a primary disadvantage of this approach is that in order to assure a high facet quality when the die is cleaved into laser cavities, the wafer must first be thinned to ≈200-250 μm before the bottom contact is deposited. NRL experiments found that handling of the thinner die throughout all the subsequent processing steps substantially increases the occurrence of unintended breakage, thereby reducing the device yield. It may be possible to mitigate this shortcoming by developing revised processing protocols. In another embodiment, the die thinning step may be eliminated to preserve high handling yield, although the cleave quality and yield may then degrade.

In another embodiment, the bottom contact is deposited after the Ag or Ti/Ag top contact as in the conventional processing, but the annealing step is omitted. An NRL reduction to practice of this approach found that failure to anneal the Cr/Pt/Au bottom contact introduced at least 1.1 V of additional voltage barrier to the bias required to operate the laser. The additional voltage will increase the device's threshold drive power and decrease the wallplug efficiency. However, it may be possible to identify an alternative bottom contact metal or develop an alternative processing protocol that reduces or eliminates the voltage penalty associated with omitting the anneal, thereby mitigating the apparent limitation.

In the case of high-power (non-DFB) epitaxial-side-down-mounted lasers operating in cw or high-duty-cycle pulsed mode, the maximum attainable power is usually limited primarily by device heating.

Since the short-period InAs/AlSb superlattice used as the top cladding material in most ICL designs has very low thermal conductivity, it may be advantageous to employ a thinner top cladding than in conventional designs in conjunction with use of the invention to mitigate the additional internal losses that occur when the lasing mode has increased overlap with the top contact metallization. Since the thermal path from the device's active core to the heat sink is shortened, the temperature increase caused by any given injection conditions will be lower.

However, this advantage must again be traded against the higher thermal resistance that occurs when the heat generated in the laser core must in some regions flow through a dielectric material before reaching the contact metal, rather than flowing directly from the semiconductor to a metal covering the entire top surface of the ridge. This additional thermal resistance for a given low-fill-factor contact pattern may be mitigated in part by employing the minimum dielectric thickness between the semiconductor surface and the metal in the non-contacted regions that can lower the optical loss and prevent electrical breakdown on the ridge sidewalls.

In many embodiments, the employment of Ti/Pt/Au top contact metal may induce relatively low optical loss because the fill factor is significantly less than 100%. Or (Ti)/Ag top contact metal may be employed to reduce the loss further. Since the Ge top grating obviates any need to etch into the semiconductor, the top of the epitaxial structure may be either $n^+$-InAsSb or a thin, unrelaxed $n^+$-InAs top contact layer without any degradation of the grating quality during the anneal of the bottom contact.

It was mentioned above that the use of conventional optical lithography limits the minimum stripe width to $\approx 10$ μm if high reproducibility and yield are to be maintained. Patterning with much higher spatial resolution, and therefore much greater flexibility in the pattern configurations that may be considered, can be accomplished using electron-beam lithography.

It was also noted above that until recently, the slow writing times for most of the available e-beam lithography systems limited this approach to patterning a few DFB lasers at a time, see Kim 2007, supra. However, newer e-beam writing instruments such as the Raith Nanofabrication Voyager™ Electron Beam Lithography system now make it quite feasible to pattern large areas within practical writing times.

One potential advantage of using e-beam lithography is that it becomes practical to pattern top contacts with fill factors <10%, but which are spaced closely enough that the current spreading provides uniform current injection. For example, periodic contact stripes of width w=3 μm and period P=30-50 μm are suitable for duty cycles of 6-10%. Narrow ridges with low top contact duty cycle for low internal loss, straight sidewalls for low scattering loss, and relatively short cavities for low active area should be optimal for minimizing the threshold drive power, a critical metric for many chemical sensing systems based on mid-IR laser spectroscopy. However, the reduction of active device area is advantageous only up to a point. NRL experiments found that the minimum optimal ridge width is ultimately limited by excessive sidewall scattering that occurs for ridges narrower than $\approx 5$ μm, while the minimum cavity length is limited by an increase in the current threshold for cavities shorter than $\approx 1$ mm.

On the other hand, if the primary objective is to maximize the output power attainable in a single spectral mode, it may be optimal to employ a ridge with low-fill-factor contacts, corrugated sidewalls (e.g., in the form of sinusoidal oscillations), and the maximum width that maintains output in a single lateral mode. Corrugated sidewalls suppress higher-order lateral lasing modes, since those are selectively scattered due to their higher intensity near the ridge boundaries. See, e.g., C. S. Kim, M. Kim, W. W. Bewley, J. R. Lindle, C. L. Canedy, J. Abell, I. Vurgaftman, and J. R. Meyer, "Corrugated-sidewall interband cascade lasers with single-mode midwave-infrared emission at room temperature," Appl. Phys. Lett. 95, 231103 (2009) ("Kim 2009").

NRL experiments have confirmed that optimized devices with corrugated sidewalls consistently produce more power in a single mode than can be obtained from ridges with straight sidewalls.

Although the corrugations also reduce the slope efficiency slightly (typically $\approx 10\%$) due to additional scattering of the fundamental mode at the sidewalls, the larger active area of a wider ridge provides a net gain in power. For the example of $\lambda \approx 3.5$ μm, a single lateral mode can be maintained to widths on the order of 10-12 μm when the sidewalls are corrugated, but only 5-7 μm when the sidewalls are straight. NRL has studied corrugation periods from 2-16 μm, and corrugation amplitudes from 2-3.5 μm.

A larger corrugation period is found to provide better beam quality with slightly higher lasing threshold and slightly lower slope efficiency. Since a larger period has the further advantage of being much less difficult to process reliably and reproducibly, ridges with sidewalls having a corrugation period of $\approx 10$ μm and an amplitude of $\approx 2$ μm are preferred in some embodiments.

A further consideration is that if maximum cw output power in a single lateral mode (and possibly single spectral mode) is the primary objective, the higher thermal resistance associated with a very low fill factor contact may lead to earlier roll-over of the L-I characteristic. Consequently, the contact fill factor that is optimal for maximizing the single-mode cw output power may be somewhat greater than the fill factor that minimizes the threshold drive power.

Although particular embodiments, aspects, and features have been described and illustrated, one skilled in the art would readily appreciate that the invention described herein is not limited to only those embodiments, aspects, and features, and that modifications may be made by persons skilled in the art. The present application contemplates any and all modifications within the spirit and scope of the underlying invention described and claimed herein, and all such combinations and embodiments are within the scope and spirit of the present disclosure.

What is claimed is:

1. A distributed feedback (DFB) interband cascade laser (ICL) or quantum cascade laser (QCL) having a low fill factor top contact configured to reduce optical loss, comprising:
   a laser ridge formed on a substrate, the laser ridge comprising:
      a bottom cladding layer;
      an active gain region disposed above the bottom cladding layer;
      a DFB grating layer having a DFB grating formed therein disposed above the active gain region;
      a thin top cladding layer disposed between the DFB grating layer and the active gain region, a thickness of the thin top cladding layer being configured to cause optical coupling to the grating to be sufficient to suppress non-resonant longitudinal modes and assure emission with a narrow linewidth from the laser; and
      a dielectric insulating film disposed on an upper surface of the DFB grating layer;
   and covering the upper surface of the laser ridge;
   wherein the dielectric insulating film has a predetermined plurality of repeated spaced-apart contact openings formed therein, running along a longitudinal length of the laser ridge, each of the contact openings extending laterally across the upper surface of the laser ridge perpendicular to a longitudinal axis of the laser ridge and being separated from a neighboring contact opening by a distance of at least 10 μm in the dielectric film;
   the laser ridge further including a top metal contact disposed on an upper surface of the dielectric insulating film, the top metal contact being connected to a voltage source to provide an electrical contact to the laser ridge in the areas exposed by the contact openings, current produced by electrical contact spreading evenly across the upper surface of the laser ridge;

wherein a lasing mode produced by the active region is insulated from the top metal contact by the dielectric film; and wherein a size and a spacing of the contact openings are configured to provide a predetermined reduction in a fill factor in the top metal contact that provides a reduction in overlap between the lasing mode and the top metal contact so as to provide a reduction in optical loss in the laser.

2. The DFB laser having a low fill factor top contact according to claim 1, wherein at least one of a size a shape, and a spacing between the contact openings is random.

3. The DFB laser having a low fill factor top contact according to claim 1, wherein the contact openings have a predetermined uniform width w and a predetermined periodic spacing P, wherein w and P are configured to provide a predetermined fill factor w/P<100%.

4. The DFB laser having a low fill factor top contact according to claim 1, wherein each of the contact openings has a corresponding width $w_i$ and is separated from an (i+1)th neighboring contact opening by a corresponding spacing $P_i$, wherein all of the widths $w_i$ and all of the spacings $P_i$ are configured so that the ratio of the average of all widths $w_i$ to the average of all the distances $P_i$ is less than 100%.

5. The DFB laser having a low fill factor top contact according to claim 1, wherein the contact openings are situated so that the openings extend across an axis running longitudinally across a center of the laser ridge.

6. The DFB interband cascade laser having a low fill factor top contact according to claim 1, wherein the DFB grating layer is a Ge, InAs, or InAsSb layer or an InAs/AlSb superlattice layer.

7. The DFB laser having a low fill factor top contact according to claim 1, wherein the dielectric insulating film is SiN.

8. The DFB laser having a low fill factor top contact according to claim 1, further comprising a pole layer having a high refractive index relative to the dielectric situated near the center of the ridge between the DFB grating layer and the dielectric insulating film.

9. The DFB laser having a low fill factor top contact according to claim 8, wherein the pole layer is Si.

10. The DFB laser having a low fill factor top contact according to claim 1, wherein a distribution of the contact openings is random.

11. A distributed feedback (DFB) interband cascade laser (ICL) or quantum cascade laser (QCL) having a low fill factor top contact configured to reduce optical loss, comprising:

a laser ridge formed on a substrate, the laser ridge comprising:
 a bottom cladding layer;
 an active gain region disposed above the bottom cladding layer;
 a DFB grating layer having a DFB grating formed therein disposed above the active gain region;
 a thin top cladding layer disposed between the DFB grating layer and the active gain region, a thickness of the thin top cladding layer being configured to cause optical coupling to the grating to be sufficient to suppress non-resonant longitudinal modes and assure emission with a narrow linewidth from the laser; and a dielectric insulating film disposed on an upper surface of the DFB grating layer;

and covering the upper surface of the laser ridge;

wherein the dielectric insulating film has a predetermined plurality of repeated spaced-apart contact openings formed therein, running along a longitudinal length of the laser ridge, the contact openings being arranged in two parallel rows, each row being situated near an outer edge of the laser ridge, parallel to a longitudinal axis of the laser ridge, each of the contact openings being separated from a neighboring contact opening along the longitudinal axis by a distance of at least 10 μm in the dielectric film;

the laser ridge further including a top metal contact disposed on an upper surface of the dielectric insulating film, the top metal contact being connected to a voltage source to provide an electrical contact to the laser ridge in the areas exposed by the contact openings, current produced by electrical contact spreading evenly across the upper surface of the laser ridge;

wherein a lasing mode produced by the active region is insulated from the top metal contact by the dielectric film; and wherein a size and a spacing of the contact openings are configured to provide a predetermined reduction in a fill factor in the top metal contact that provides a reduction in overlap between the lasing mode and the top metal contact so as to provide a reduction in optical loss in the laser.

12. The DFB laser having a low fill factor top contact according to claim 11, wherein at least one of a size, a shape, and a spacing between the contact openings in one or both of the rows of openings is random.

13. The DFB laser having a low fill factor top contact according to claim 11, wherein each of the contact openings has a corresponding width $w_i$ and is separated from an (i+1)th neighboring contact opening by a corresponding spacing $P_i$, wherein all of the widths $w_i$ and all of the spacings $P_i$ are configured so that the ratio of the average of all widths $w_i$ to the average of all the distances $P_i$ is less than 100%.

14. The DFB laser having a low fill factor top contact according to claim 11, wherein the contact openings in the two parallel rows are configured so as to be aligned with each other in phase.

15. The DFB laser having a low fill factor top contact according to claim 11, wherein the contact openings in the two parallel rows are configured so as to be aligned with each other out of phase.

16. The DFB interband cascade laser having a low fill factor top contact according to claim 11, wherein the DFB grating layer is a Ge, InAs, or InAsSb layer or an InAs/AlSb superlattice layer.

17. The DFB laser having a low fill factor top contact according to claim 11, wherein the dielectric insulating film is SiN.

18. The DFB laser having a low fill factor top contact according to claim 11, further comprising a pole layer having a high refractive index relative to the dielectric situated near the center of the ridge between the DFB grating layer and the dielectric insulating film.

19. The DFB laser having a low fill factor top contact according to claim 18, wherein the pole layer is Si.

20. The DFB laser having a low fill factor top contact according to claim 11, wherein a distribution of the contact openings in one or both of the rows of openings is random.

* * * * *